US005942892A

United States Patent [19]

Li

[11] Patent Number: 5,942,892

[45] Date of Patent: Aug. 24, 1999

[54] METHOD AND APPARATUS FOR SENSING ARMATURE POSITION IN DIRECT CURRENT SOLENOID ACTUATORS

[75] Inventor: Long-Jang Li, Waukesha, Wis.

[73] Assignee: Husco International, Inc., Waukesha, Wis.

[21] Appl. No.: 08/944,791

[22] Filed: Oct. 6, 1997

[51] Int. Cl.[6] .......... G01B 7/14; F16K 37/00; G01R 27/16

[52] U.S. Cl. .......... 324/207.16; 324/207.24; 137/554

[58] Field of Search .......... 324/207.16, 207.22, 324/207.24, 207.26, 654; 137/554; 340/644, 686; 361/152, 153, 154, 160, 170, 187

[56] References Cited

U.S. PATENT DOCUMENTS

| | | | |
|---|---|---|---|
| 3,789,876 | 2/1974 | Kempton et al. | 137/554 |
| 3,828,247 | 8/1974 | Kirsch et al. | 324/28 R |
| 4,321,946 | 3/1982 | Paulos et al. | 137/554 |
| 4,545,530 | 10/1985 | Hofmann et al. | 239/72 |
| 4,907,901 | 3/1990 | Mitchel | 400/157.2 |
| 4,941,348 | 7/1990 | Hock | 73/119 A |
| 5,046,702 | 9/1991 | Miyazawa et al. | 251/129.04 |
| 5,115,193 | 5/1992 | Bean et al. | 324/207.12 |
| 5,172,298 | 12/1992 | Shimzu et al. | 361/152 |
| 5,193,568 | 3/1993 | Eissenberg et al. | 137/1 |
| 5,196,983 | 3/1993 | Stumpf | 361/187 |
| 5,313,161 | 5/1994 | Miyazawa et al. | 324/207.16 |
| 5,424,637 | 6/1995 | Oudyn et al. | 324/207.16 |
| 5,481,187 | 1/1996 | Marcott et al. | 324/207.16 |
| 5,497,804 | 3/1996 | Codina et al. | 137/554 |
| 5,523,684 | 6/1996 | Zimmermann | 324/207.22 |
| 5,578,904 | 11/1996 | Marcott et al. | 324/207.16 |
| 5,583,434 | 12/1996 | Moyers et al. | 324/207.16 |

*Primary Examiner*—Walter E. Snow
*Attorney, Agent, or Firm*—Quarles & Brady LLP

[57] ABSTRACT

An apparatus detects a position of an armature within a solenoid coil by superimposing a fixed frequency sensing signal onto the coil driver signal. The combined signal is applied to the solenoid coil and an alternating current component varies with changes in inductance of the solenoid coil that result from position changes of the armature. A current sensor produces an output signal indicating a level of current flowing through the solenoid coil and a filter extracts the alternating component of that output signal that results from the sensing signal. A position circuit determines the position of the armature from an output from the filter.

23 Claims, 7 Drawing Sheets

TIME DOMAIN

FREQUENCY DOMAIN

METHOD AND APPARATUS FOR SENSING ARMATURE POSITION IN DIRECT CURRENT SOLENOID ACTUATORS

BACKGROUND OF THE INVENTION

The present invention relates to reluctance type electromagnetic actuators, and more particularly to sensing the position of an armature in such actuators.

Many types of machines have moveable members which are operated by a hydraulic cylinder and piston arrangement. Hydraulic fluid is supplied under pressure via a valve to the cylinder and pushes against the piston to move the machine member. By varying the degree to which the valve is opened, the flow rate of the hydraulic fluid can be varied thereby moving the piston at proportional speeds. Typically the valve is operated manually by a lever that was mechanically connected to a spool within the valve.

A current trend is away from using manually operated hydraulic valves toward electrically controlled solenoid valves. Solenoid valves are well known reluctance electromagnetic actuators for controlling the flow of a fluid. A solenoid valve involves an electromagnetic coil which moves an armature in one direction to open a valve. The valve may be opened to various degrees by varying the magnitude of the electric current flowing through the coil of the solenoid. Either the armature or a valve member is spring loaded so that when the current is removed from the solenoid coil, the valve closes.

In an electrohydraulic controller, there is no mechanical connection between the operator control mechanism and the valve. Therefore when an operator moves the control mechanism to a given position, there is no way of knowing, by tactile, visual or other feedback, whether the valve opened the corresponding amount. The actual position of the valve may vary in response to different operational characteristics. The obvious solution would be to attach mechanical position sensing devices to the valve to provide a feedback signal indicating the relative position of the valve. The electrical valve control circuit then could compared the sensed valve position with the desired position commanded by the operator and adjust the electric current applied to the solenoid coil until the desired position is achieved. Although such mechanical position transducers could solve the basic feedback problem, it is desirable to provide an entirely electrical, i.e. non-mechanical, technique for sensing the position of an armature in such actuators. That alternative approach would not be prone to mechanical failure and would be easier to maintain, and would be more cost effective.

SUMMARY OF THE INVENTION

An object of the present invention is to provide an apparatus for detecting the position of an armature of a reluctance type electromagnetic actuator without the use of conventional physical position transducers.

Another object is to provide a non-mechanical position detecting apparatus.

A further object of the present invention is to provide such a detecting apparatus which determines the armature position based on electrical signals from the solenoid coil.

Yet another object is to perform the armature position sensing by superimposing a sensing signal onto the current regulating signal for the coil of the electromagnetic actuator and extract spatial information from the coil current feedback correlated to the sensing signal.

Another aspect of the present invention is to utilize such position sensing with a solenoid operated hydraulic valve.

These and other objectives are satisfied by an apparatus that includes a first source of a current regulating signal that has a current level which is varied to move the armature into a plurality of positions. A second source produces a fixed frequency sensing signal which is combined with the current regulating signal to form a composite signal. When the composite signal is applied to the solenoid coil, its alternating current component varies as a result of changes in the inductance of the coil due to variation of the armature position.

A sensing circuit measures the magnitude of current flowing through the solenoid coil and extracts the alternating current component which is attributable to the fixed frequency sensing signal. The fixed frequency sensing signal is superimposed onto the current regulating signal to provide a way of sensing the position of the armature as the alternating current component that results from the sensing signal changes primarily due to armature position changes. A position circuit employs the level of the alternating current component to determine the position of the armature within a coil of a solenoid actuator.

DETAILED DESCRIPTION OF THE INVENTION

Figure 1:
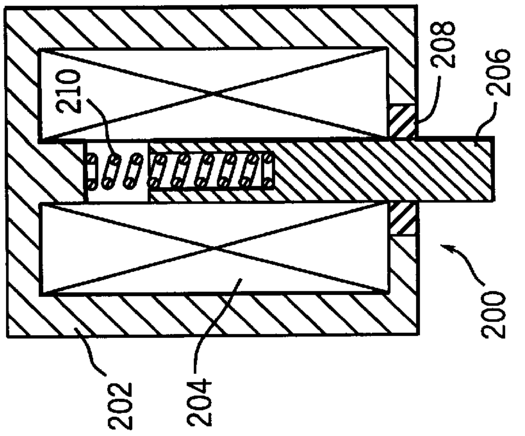
FIG. 1 is a cross-section view of a typical reluctance electromagnetic actuator.

With initial reference to FIG. 1, a reluctance type electromagnetic actuator 200 includes a stationary core 202 of magnetic material which surrounds a coil 204 of wire. An armature 206 is located within the coil 204 and extends through an opening in the stationary core 202 being separated therefrom by a non-magnetic bearing 208. A spring 210 biases the armature outward from the coil 204. The armature is connected to a mechanism which is operated by the armature movement as will be described.

When an electric current is applied to the coil 204 a magnetic field is produced which tends to draw the armature 206 into the coil against the force of spring 210. A magnetic flux path is provided by the armature 206 and the stationary core 202. The distance that the armature 206 moves into the coil 204 can be controlled by varying the magnitude of the electric current. Specifically that distance is proportional to the current magnitude.

Figure 2:
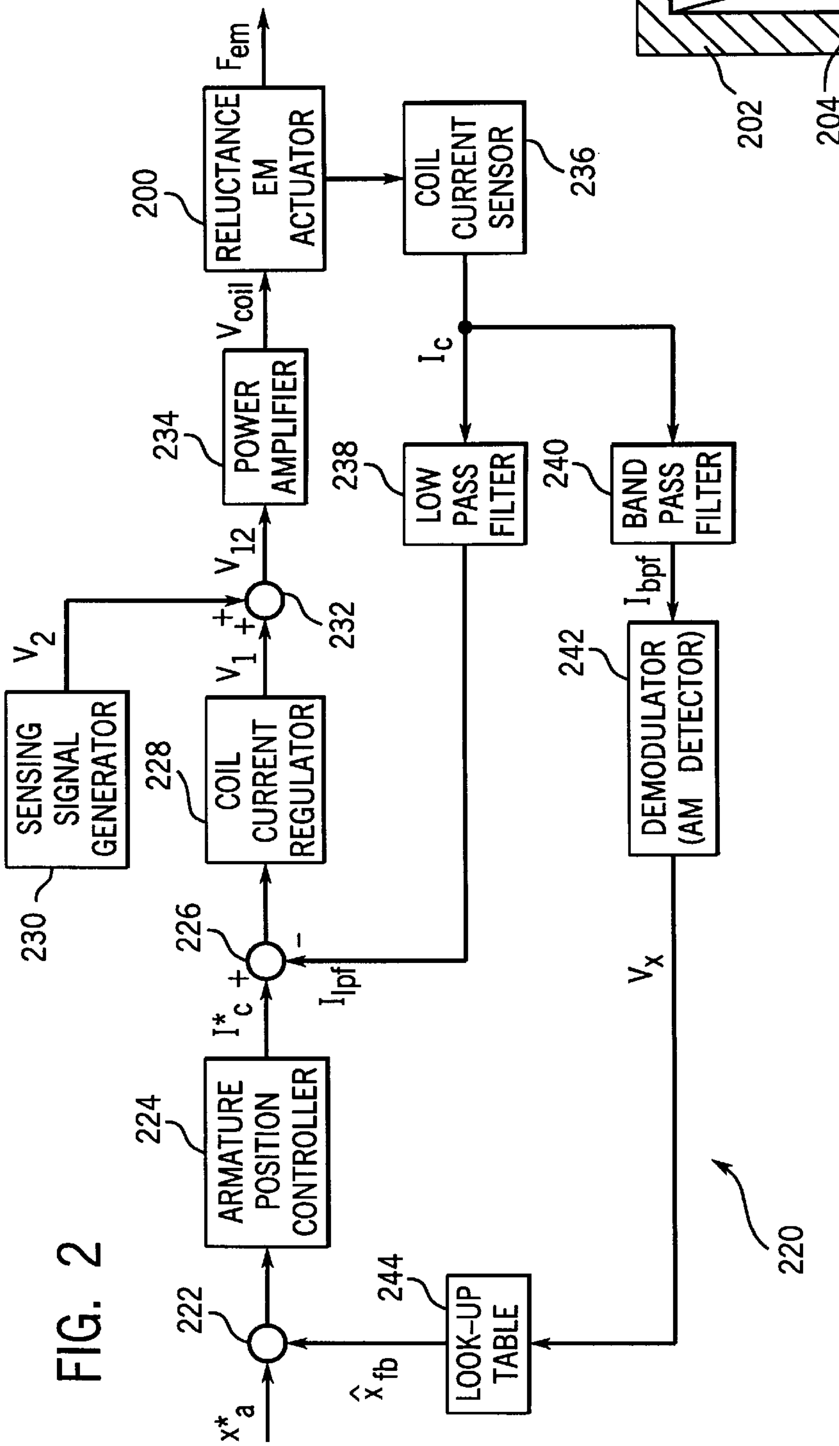
FIG. 2 is a system schematic representation of a armature position sensing in a reluctance electromagnetic actuator according to the present invention.
Figure 3A:
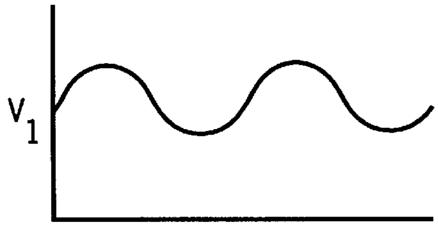
FIGS. 3A–3F are time domain waveform diagrams of signals at different points in the actuator system that uses a linear amplifier.
Figure 3B:
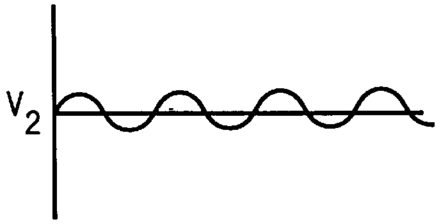
Figure 3C:
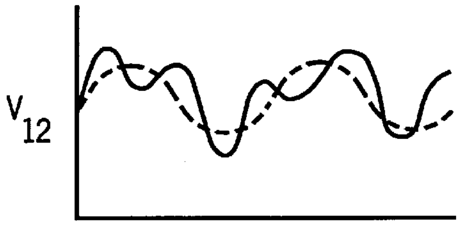

FIG. 2 illustrates a generic actuator system 220 for controlling position of the armature 206. The power amplifier 234 could be a PWM solenoid driver or a linear solenoid driver and the same methodology applied to either embodiment. An input signal $x_a$* designates the desired position of the armature and is applied via a first summing node 222 to an input of an armature position controller 224. The armature position controller 224 produces a current command signal $I_c$* which corresponds to the level of electric current to be applied to reluctance electromagnetic actuator 200 to move the armature 206 to the desired position. The current command signal is applied to one input of a second summing node 226 having an output fed to a coil current regulator 228 which produces a coil current regulation signal $v_1$ signal that has a bandwidth of frequency $f_b$. The coil current regulation signal is combined at a third summing node 232 with a sensing signal $v_2$ at a fixed second frequency $f_2$ from a sensing signal generator 230. FIGS. 3A and 3B depict the coil current regulation signal $v_1$ and the sensing signal $v_2$ for a control system using a linear amplifier. The combination of those signals $v_{12}$ at the output of the third summing node 232 is depicted in FIG. 3C. The frequency domain representation of those three signal is given in Figured 4A, 4B and 4C, respectively. The output of the third summing node 232 is fed to a power amplifier 234 that produces a voltage $V_{coil}$ which drives the coil 204 of the reluctance electromagnetic actuator 200.

Figure 3D:
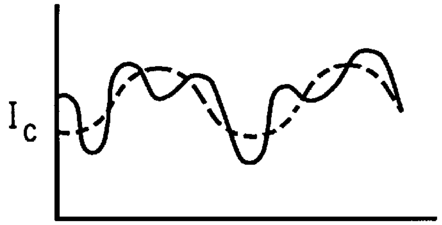
Figure 4A:
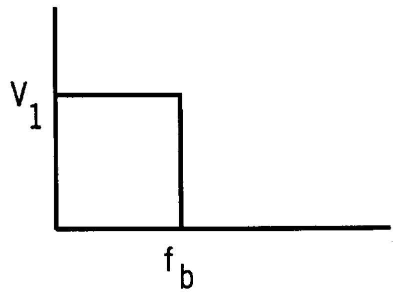
FIGS. 4A–4F are frequency domain waveform diagrams of signals at the different points in the actuator system that uses a linear amplifier.
Figure 4B:
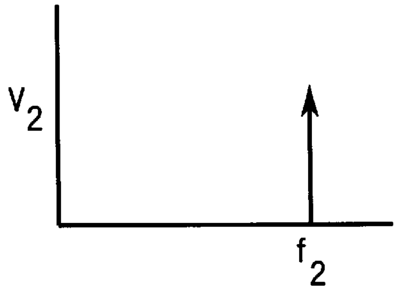
Figure 4C:
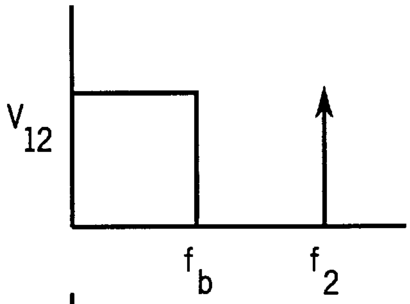
Figure 4D:
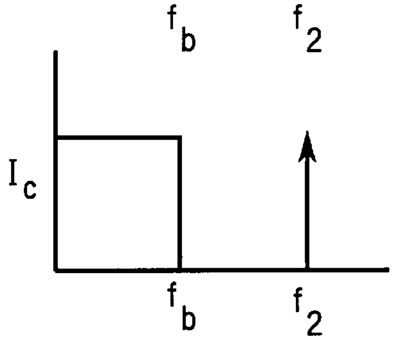

A sensor 236 detects the magnitude of the electric current flowing through coil 204 and produces a current feedback signal $I_c$ (FIGS. 3D and 4D) which indicates that current magnitude. This feedback signal $I_c$ primarily comprises two components: a low frequency component up to the current regulation bandwidth $f_b$ and an alternating component at the sensing signal frequency $f_2$. The current sensor output signal $I_c$ is connected to a low pass filter 238 which extracts the low frequency component $I_{lpf}$ of that output signal and applies that component $I_{lpf}$ to the second summing node 226 as a current control feedback signal. Ideally that control feedback signal $I_{lpf}$ should be the same as the current command signal $I_c$*. If not the input to the coil current regulator 228 changes until the two signals are the same.

Figure 3E:
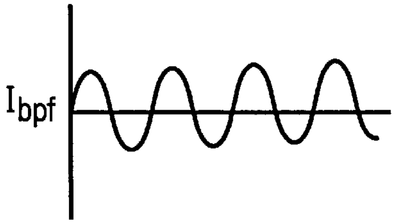
Figure 3F:
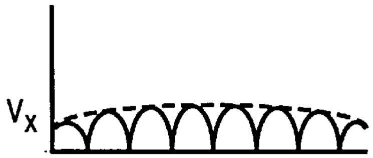
Figure 4E:
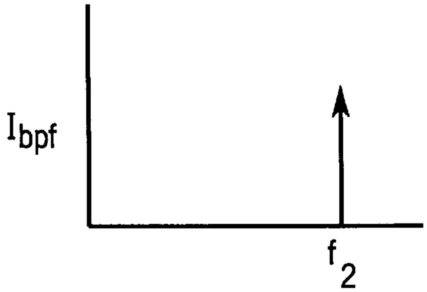
Figure 4F:
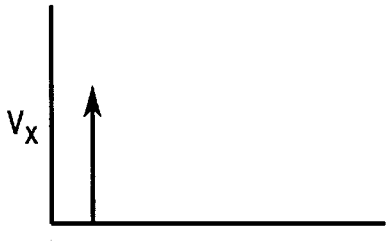

The current sensor output signal $I_c$ also is connected to a band pass filter 240 with the center frequency of the pass band tuned to the sensing signal frequency $f_2$. This extracts the alternating current component $I_{bpf}$ (FIGS. 3E and 4E) which is applied to the input of an AM detector 242 that detects the envelope 243 of the alternating current component and produces an armature position dependent signal $V_x$ as depicted in FIGS. 3F and 4F.

The output of the demodulator 242 is employed to address a look-up table to determine the corresponding location of the armature as indicated by the alternating current level of the sensing signal flowing through the coil 204. A signal indicating the sensed armature location is applied to another input of the first summing node 222 which compares that input signal to the desired armature position $x_a$*. Ideally the sensed location should match the desired position of the armature, if not the signal applied to the armature position controller 224 changes until the two signals are the same at which time the armature is in the desired position.

Figure 5:
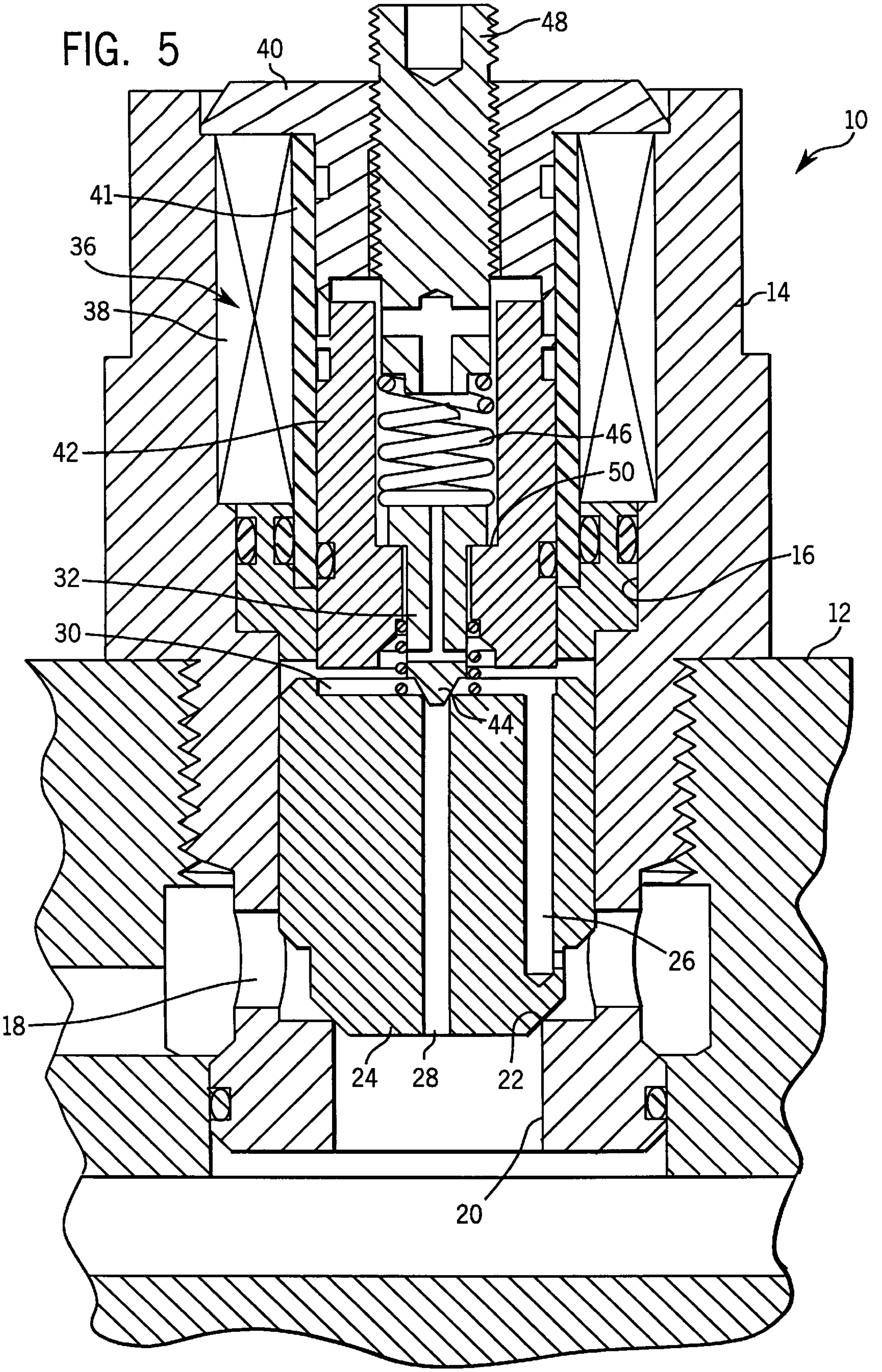
FIG. 5 is a cross-section of a solenoid operated pilot valve with which the present invention may be used.

The present methodology of sensing the location of the armature may be applied to a wide variety of reluctance type electromagnetic actuators, such as a solenoid operated valve shown in FIG. 5. The solenoid valve 10 is mounted within a hydraulic fluid distribution block 12 and comprises a valve body 14 with a longitudinal bore 16 extending therethrough. The valve body 14 has a transverse inlet passage 18 which extends through the valve body 14 communicating with the internal bore 16. An outlet passage 20 communicates with the inlet passage 18 at a valve seat 22. A main valve poppet 24 is slidably positioned within the central bore 16 and selectively engages the valve seat 33 to close and open fluid communication between the inlet and outlet passages 18 and 20.

The main poppet 24 has a pilot passage therethrough which is subdivided into an inlet section 26, outlet section 28 and intermediate chamber 30 of the valve bore 16. The flow of hydraulic fluid through the pilot passage is controlled by a pilot valve 32 which selectively opens and closes an opening of the outlet section 28 into the intermediate chamber 30, as will be described.

Movement of the pilot valve 32 is controlled by a solenoid actuator 36 comprising a solenoid coil 38 received within one end of the bore 16 and held in place by an end plate 40. A sleeve 41 of non-magnetic material is located within the bore of the solenoid coil 38 and a tubular armature 42 extends within the sleeve 41 and projects toward the main valve poppet 24. In response to the electromagnetic field created by energizing solenoid coil 38, the armature 42 slides within the sleeve 41 between the end plate 40 and the main valve poppet 24. The pilot valve 32 is located within the bore of the tubular armature 42 and is biased toward one end of the armature by a spring 46. An adjusting piston 48 is threaded into an aperture in the end plate 40 for manual adjustment of the spring preload force.

In the de-energized state of the solenoid coil 38, the primary spring 46 forces the pilot valve 32 against a shoulder 50 in the bore of the armature 42 pushing both the armature and the pilot valve toward the main valve poppet 24. In this state, a frustoconical portion 44 of the pilot valve 32 engages the opening of the pilot passage outlet section 28 into the intermediate chamber 30 thereby closing the pilot passage to the flow of hydraulic fluid. A secondary spring 52 biases the main valve poppet 24 away from the armature 42.

The application of electric current to the solenoid coil 38 generates an electromagnetic field which draws the armature 42 into the solenoid coil and away from the main valve poppet 24. The distance that the armature moves into the solenoid coil against the force of spring 46 is proportional to the magnitude of the electric current. Because the armature shoulder 50 abuts a mating surface on the pilot valve 32, that latter element also moves away from the main valve poppet 24. This action moves the frustoconical portion 44 away from the opening of the pilot passage allowing fluid to flow from the inlet passage 18 through the pilot passage inlet section 26, intermediate chamber 30 and the outlet section 28 to the outlet passage 20. This flow of hydraulic fluid creates a pressure differential between the intermediate chamber 30 and the outlet passage 20 with the remote chamber having a lower pressure.

As a consequence of this pressure differential, the main valve poppet 24 moves away from the primary valve seat 22 opening the inlet passage 18 directly into the outlet passage 20. The movement of the main valve poppet 24 continues until it contacts the frustoconical portion 44 of the pilot poppet 32. Thus, the degree to which the main valve poppet 24 moves with respect to valve seat 22 is determined by the position of the armature 42 and pilot poppet 32. This position is in turn controlled by the magnitude of the current flowing through the solenoid coil 38. The rate of hydraulic fluid flow through the solenoid valve 10 is in direct proportion to the magnitude of electric current applied to the solenoid coil 38.

Figure 6:
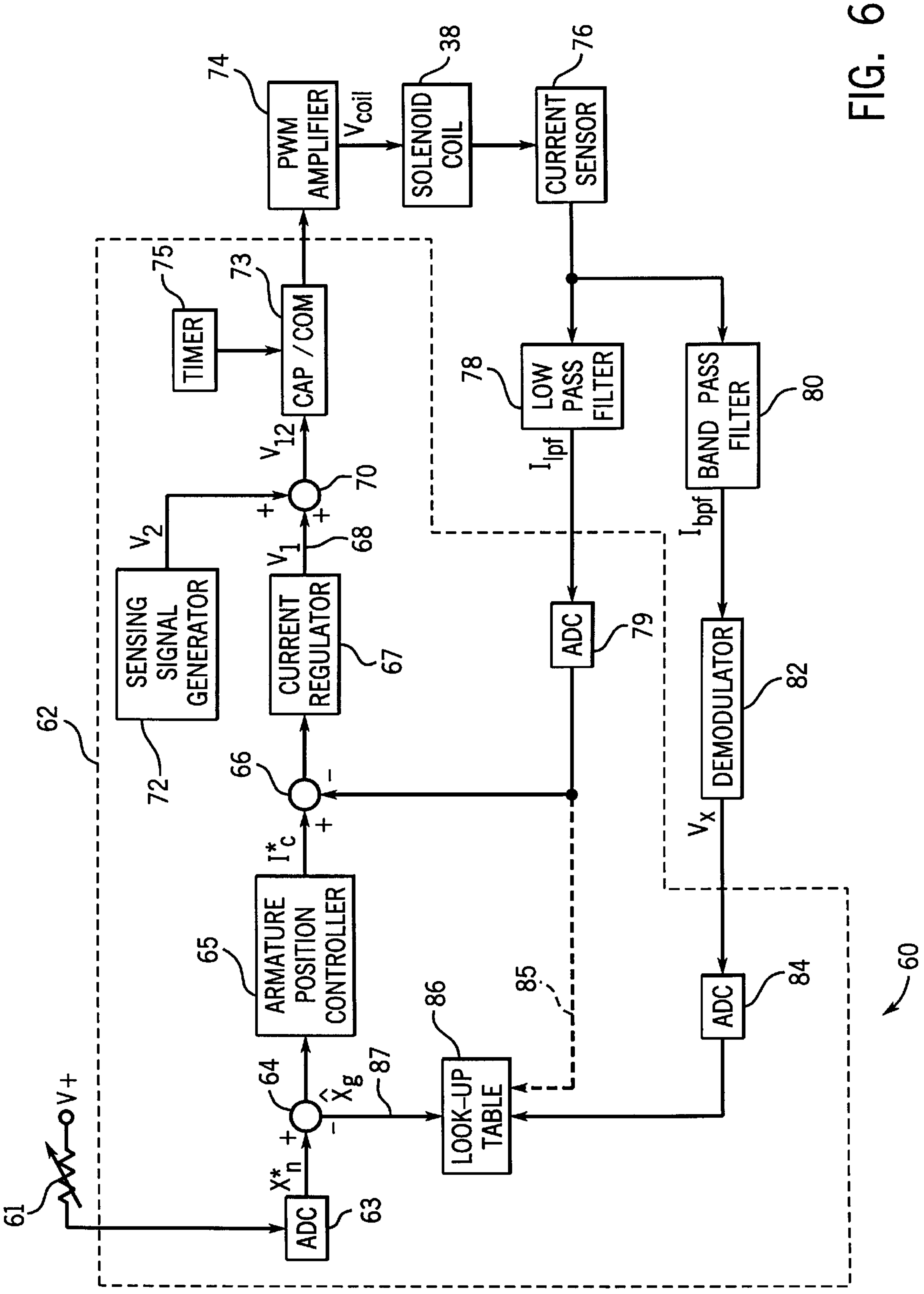
FIG. 6 is a schematic illustration of using a PWM solenoid driver circuit, that incorporates the present invention.

With reference to FIG. 6, the solenoid coil 38 is electrically driven by a circuit 60 which incorporates the present invention and provides a pulse width modulated voltage $V_{coil}$ that is applied to the solenoid coil. For a manually controlled valve, the operator manipulates a control mechanism coupled to a variable resistor 61 that determines the amount that the solenoid valve 10 is desired to be opened. The variable resistor 61 produces an input signal that is applied to an analog input of a microcontroller 62 and therein digitized by via a first analog-to-digital (ADC) 63. That input signal designates the level of electric current that is desired to open solenoid valve 10 to the position indicated by the operator. Instead of a manually operated control mechanism, such as variable resistor 61, the microcontroller 62 could receive a similar signal from another electronic circuit. In addition, the microcontroller 62 could be utilized to control a number of valves and perform other functions within the machine.

The output of the first ADC 63 is connected to one input of a summing node 64 and the resultant signal is applied to the control input an armature position controller 65. The input signal to the armature position controller 65 indicates the desired position of the armature and from that position signal, the controller 65 produces an output signal $I_c$* which indicates the level of electric current required for the solenoid coil to drive the armature to that desired position. The output signal from the armature position controller 65 is applied to another summing node 66 with an output connected to a control input of a current regulator 67. In this particular implementation, the current regulator 67 produces a current regulating, or driver, signal $v_1$ on line 68 indicating the duty cycle of a PWM signal at a fixed frequency $f_1$ wherein the width of each pulse varies in proportion to the desired level of current, as determined by the error signal applied to the control input 65. That is, the magnitude of the current is varied by changing the duration, or width, of the pulses.

The output signal $v_1$ from current regulator 67 is applied to yet another summing node 70 having another input which receives a second signal $v_2$ produced by a sensing signal generator 72. The sensing signal $v_2$ has relatively short, but constant duty cycles with zero offset which occur simultaneously with the current regulating signal $v_1$, but at a different frequency $f_2$. Frequency $f_2$ is lower than the PWM switching frequency $f_1$, while higher than the current regulator bandwidth $f_b$. Preferably frequency $f_1$ is an integer multiple of frequency $f_2$. This relationship of the second (sensing) signal $v_2$ to the current regulating signal does not significantly affect the level of current applied to the solenoid coil which is primarily a function of the current regulating signal. The alternating current component resulting from the second signal is not operator variable and changes primarily due to variation of the solenoid coil inductance which is a function of the armature position.

The combined digital signal, having frequency components $f_1$, $f_2$ and their harmonics, controls a pulse width modulation (PWM) amplifier 74. Specifically each value of that combined digital signal is stored in a capture and compare register 73 and then is decremented by periodic pulses from a timer 75. The output of the capture and compare register 73 has a high logic level as long as its contents are greater than zero, otherwise the output is a low logic level. The capture and compare register output is connected to the control input of the pulse width modulation (PWM) amplifier 74 which produces an output voltage $V_{coil}$, which has a positive voltage pulse only while output of the capture and compare register 73 is at a high logic level. The output voltage $V_{coil}$ is applied to the solenoid coil 38 to move the armature 42, thereby opening the solenoid valve 10 the desired amount. The second signal at frequency $f_2$ produced by the sensing signal generator 72 acting as a sensing signal is superimposed on the current regulating signal which drives the solenoid coil 38. The constant duty cycle sensing signal provides a reference signal and that can be employed to measure the inductance of the coil which then can be used as an indication of the armature position. FIGS. 7A–7C and 8A–8C show the current regulating signal $v_1$, the sensing signal and the composite signal $v_{12}$ in time and frequency domains respectively.

In order to ensure that the solenoid armature 42 moves to the proper position, a current sensor 76 detects the current flowing through the solenoid coil 38. It should be understood that the inductance of the solenoid coil 38, and thus the magnitude of the alternating current component drawn by that coil, is a function of the armature position within the solenoid coil. As the armature changes position, a corresponding change in the coil inductance and the alternating current component occurs. Specifically, the farther the armature 42 moves into the solenoid coil 38, the greater the inductance of the solenoid coil 38 and the less of the alternating current component flowing through that coil. Thus, by sensing the alternating current component consumed by the solenoid coil, one is able to determine the relative position of the armature 42. Since the armature position is reflected in the position of the main valve poppet 24, the armature position also indicates the flow rate of hydraulic fluid through the solenoid valve 10.

The current sensor 76 produces an output voltage level that corresponds to the instantaneous current being supplied to the solenoid coil 38. The current sensor output is connected to a low pass filter 78 which extracts the low frequency current component of the current sensor signal and applies that component to a second input of the summing node 64 as a current control feedback signal. This signal is digitized by a second analog-to-digital 79. The digitized current control feedback signal, representing the sensed current, is subtracted at the second node 66 from the current level signal generated by the armature position microcontroller 62 to produce resultant signal that represents the difference between the actual current supplied to the solenoid coil 38 and the desired current level. This is a common feedback loop similar to those used in previous solenoid control circuits. Such feedback mechanisms merely ensure that the output current is the same as that desired and do not determine whether the solenoid armature is positioned properly.

Figure 7A:
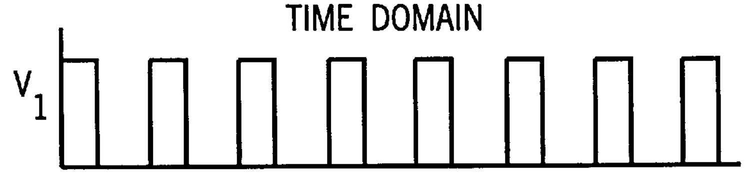
FIGS. 7A–7F and 8A–8F are signals in the time and frequency domains, respectfully, at different points in an actuator system that uses a PWM amplifier.
Figure 7B:
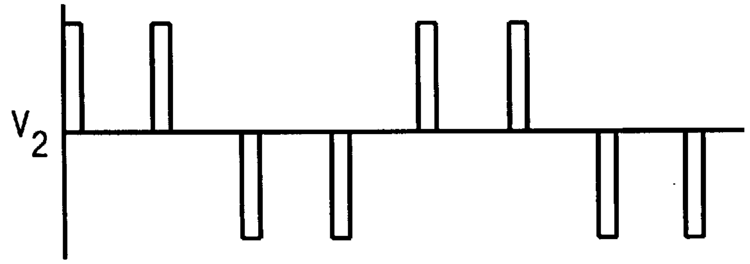
Figure 7C:
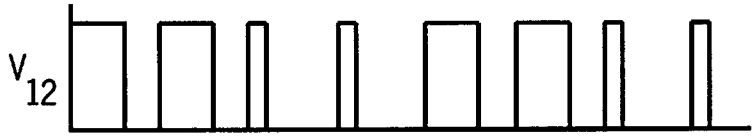
Figure 7D:
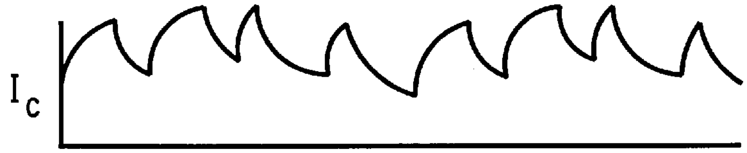
Figure 7E:
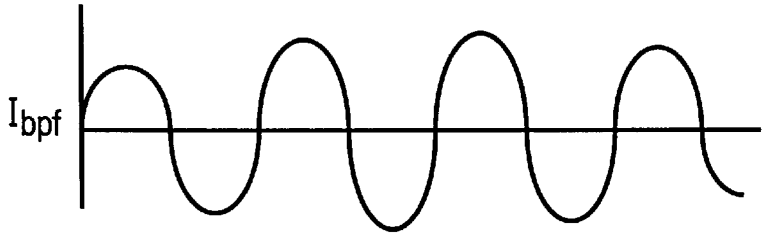
Figure 7F:
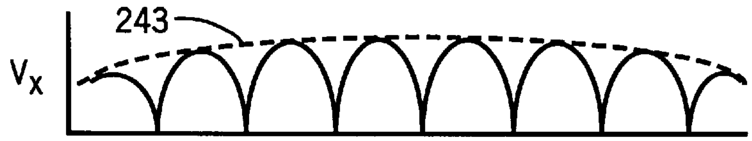
Figure 8A:
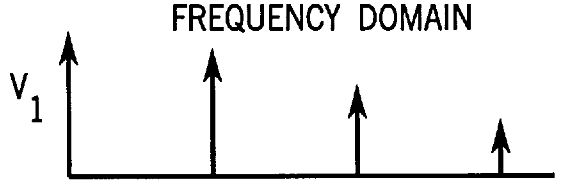
Figure 8B:
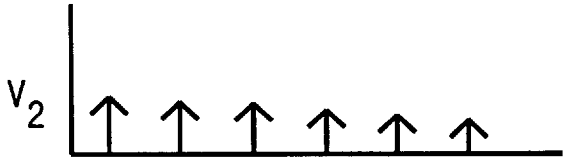
Figure 8C:
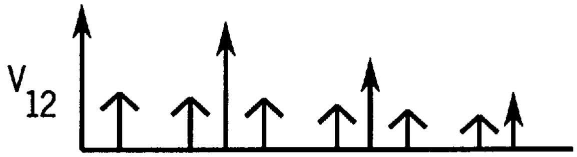
Figure 8D:
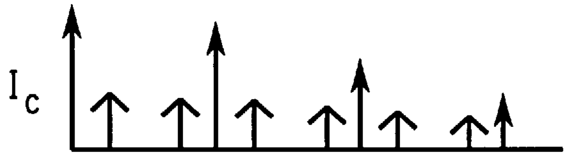
Figure 8E:
Figure 8F:

To determine whether the solenoid armature is at the desired position, the output of current sensor 76 also is applied to a band pass filter 80 having a high quality factor Q and the center of the pass band tuned to the sensing signal frequency $f_2$. Thus, the output of the band pass filter 80 (FIGS. 7D and 8D) corresponds to the fundamental alternating current component of the current sensor signal attributable to the signal from the sensing signal generator 72. The amplitude of this filtered signal varies in correspondence with the changes in the inductance of the solenoid coil 38. The output of the band pass filter 80 is applied to the input of a conventional amplitude modulation (AM) detector 82 which produces an armature position dependent signal that fluctuates with changes in the amplitude of the filtered signal, as shown in FIGS. 7E and 8E.

The output of the demodulator 82 is converted into a digital value by a third analog-to-digital converter 84. The resultant digital value corresponds to the magnitude of the alternating current component and is applied to address a digital memory device containing a look-up table 86 which maps the sensed alternating current component to a position of the solenoid armature 42. In some applications of the present invention, it may be satisfactory to determine the position of the armature merely from the amplitude of the alternating current component in the current sensor signal. However, in other instances, it may be desirable to utilize a two dimensional look-up table 86 in which the DC current component also is utilized to address the particular storage location in the table. In this instance, the output of low pass filter 78 corresponding to the DC current level is also fed to the look-up table 86 as indicated by the dashed line 85. In essence, the two different inputs from the first and second analog to digital converters 79 and 84 are used to address different axes of a two dimensional table. The intersection of the addresses is a storage location that contains the armature position.

The output 87 of the look-up table 86 is applied to a second input of the first summing node 64 which compares the sensed armature position with a commanded armature position that will produce the desired flow rate. As a result of this comparison, the desired current level command is varied to move the armature into the desired position and produce the requisite flow rate.

I claim:

1. An apparatus for detecting a position of an armature within a coil of a solenoid actuator, the apparatus comprising:

a first source of a driver signal having a current which is varied to move the armature into a plurality of positions;

a second source of a position sensing signal having a given frequency;

a device which combines the driver signal and the sensing signal to form a composite signal;

a conductor for connecting the device to the coil;

a current sensor which produces a sensor signal indicating a level of current flowing through the coil;

a filter that passes a component of the sensor signal at the given frequency to produce a filter signal; and a position circuit connected to the filter and comprising an amplitude modulation detector and which processes the filter signal to produce a location signal indicating the position of the armature.

2. The apparatus as recited in claim 1 wherein the first source produces a pulse width modulated driver signal in which pulses have a width that varies depending upon a desired position for the armature.

3. The apparatus as recited in claim 1 wherein the second source produces a pulsed signal having a substantially constant frequency and a substantially constant duty cycle.

4. The apparatus as recited in claim 1 wherein the first source produces a pulse width modulated driver signal having a first frequency; and the second source produces the sensing signal which has a second frequency.

5. The apparatus as recited in claim 4 wherein the first frequency is an integer multiple of the second frequency.

6. The apparatus as recited in claim 1 wherein the position circuit comprises a look-up table that receives an output signal from the amplitude modulation detector.

7. The apparatus as recited in claim 1 wherein the position circuit comprises and analog to digital converter that receives the filter signal and produces a digital value; and a storage device having address inputs to which the digital value is applied and containing a look-up table in which a plurality of armature position values are stored.

8. The apparatus as recited in claim 1 wherein the first source is a variable DC current source.

9. The apparatus as recited in claim 1 wherein the second source produces a sinusoidal sensing signal having a substantially constant frequency and a substantially constant amplitude.

10. The apparatus recited in claim 1 further comprising a control circuit having a first input that receives an input signal indicating a desired position for the armature, a second input that receives the location signal from the position circuit, and produces a current command in response to the input and location signals wherein the current command controls the first source to vary the current of the driver signal.

11. The apparatus recited in claim 10 further comprising a low pass filter connected to an output of the current sensor to produce a current feedback signal; and another device producing a source control signal that corresponds to a difference between the feedback signal and the current command, wherein the source control signal is applied to the first source.

12. An apparatus for detecting a position of an armature within a coil of a solenoid actuator, the apparatus comprising:

a first source of a driver signal having a first frequency and being pulse width modulated to move the armature into a plurality of positions within the coil;

a second source of a sensing signal having a second frequency;

a device which combines the driver signal and the sensing signal to form a composite signal;

a conductor for connecting the device to the coil;

a sensing circuit including a current sensor that produces an output signal indicating a level of current flowing through the coil, a band pass filter that passes a component of output signal which corresponds to the second frequency; and an amplitude detector connected to an output of the band pass filter; and a position circuit connected to the sensing circuit and determining the position of the armature within a coil of a solenoid actuator in response to a signal from the amplitude detector which corresponds to a current magnitude of the sensing signal.

13. A method for detecting a position of an armature within a coil of a solenoid actuator, the method comprising:

producing a current regulating signal which is varied to move the armature into a plurality of positions;

generating a sensing signal;

combining the current regulating signal and the sensing signal to form a composite signal;

applying the composite signal to the coil;

detecting a magnitude of current flowing through the coil to produce a current signal;

filtering the current signal to extract a component signal which results from the sensing signal; and amplitude demodulating the component signal to determine the position of the armature within the coil.

14. The method as recited in claim 13 wherein producing a current regulating signal produces a pulse width modulated signal.

15. The method as recited in claim 13 wherein the sensing signal is a pulsed signal.

16. The method as recited in claim 13 wherein producing a driver signal produces a pulse width modulated signal which has a first frequency; and the generating step produces a sensing signal having a second frequency, wherein the first frequency is an integer multiple of the second frequency.

17. The apparatus as recited in claim 1 wherein the filter is a band pass filter.

18. The method as recited in claim 13 further comprising employing a resultant signal from the step of amplitude demodulating to address a look-up table in a storage device and to read out a position value from the storage device.

19. An apparatus for detecting a position of an armature within a coil of a solenoid actuator, the apparatus comprising:

a first source of a pulse width modulated driver signal in which pulses have a width that varies to move the armature into a plurality of positions;

a second source of a position sensing signal;

a device which combines the driver signal and the sensing signal to form a composite signal;

a conductor for connecting the device to the coil;

a sensing circuit to measure a magnitude of current of the sensing signal which flows through the coil; and a position circuit connected to the sensing circuit and determining the position of the armature within a coil of a solenoid actuator from the magnitude of current of the sensing signal, the position circuit producing a location signal indicating that position of the armature.

20. The apparatus as recited in claim 19 wherein the second source produces a pulsed signal having a substantially constant frequency and a substantially constant duty cycle.

21. The apparatus as recited in claim 19 wherein the first source produces a pulse width modulated driver signal having a first frequency; and the second source produces the sensing signal which has a second frequency.

22. The apparatus as recited in claim 21 wherein the first frequency is an integer multiple of the second frequency.

23. The apparatus as recited in claim 21 wherein the sensing circuit comprises a current sensor that produces an output signal indicating a level of current flowing through the coil; and a band pass filter that passes a component of output signal corresponding to the second frequency.

* * * * *